(12) United States Patent
Schug

(10) Patent No.: US 9,461,027 B2
(45) Date of Patent: Oct. 4, 2016

(54) LED PACKAGE AND MANUFACTURING METHOD

(71) Applicant: KONINKLIJKE PHILIPS N.V., Eindhoven (NL)

(72) Inventor: Josef Andreas Schug, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/419,539

(22) PCT Filed: Aug. 2, 2013

(86) PCT No.: PCT/IB2013/056353
§ 371 (c)(1),
(2) Date: Feb. 4, 2015

(87) PCT Pub. No.: WO2014/024108
PCT Pub. Date: Feb. 13, 2014

(65) Prior Publication Data
US 2015/0214201 A1 Jul. 30, 2015

Related U.S. Application Data

(60) Provisional application No. 61/680,331, filed on Aug. 7, 2012.

(51) Int. Cl.
*H01L 33/00* (2010.01)
*H01L 25/16* (2006.01)
(Continued)

(52) U.S. Cl.
CPC ....... *H01L 25/167* (2013.01); *H01L 21/76898* (2013.01); *H01L 21/78* (2013.01); *H01L 23/481* (2013.01); *H01L 24/94* (2013.01); *H01L 25/0753* (2013.01); *H01L 25/165* (2013.01); *H01L 27/0248* (2013.01); *H01L 33/486* (2013.01); *H01L 33/62* (2013.01); *H05B 33/083* (2013.01); *H01L 24/13* (2013.01); *H01L 24/16* (2013.01); *H01L 24/17* (2013.01); *H01L 24/81* (2013.01); *H01L 2224/133* (2013.01); *H01L 2224/13025* (2013.01); *H01L 2224/1329* (2013.01); *H01L 2224/13244* (2013.01); *H01L 2224/13395* (2013.01); *H01L 2224/16146* (2013.01); *H01L 2224/16225* (2013.01); *H01L 2224/16227* (2013.01); *H01L 2224/17181* (2013.01); *H01L 2224/8185* (2013.01); *H01L 2224/81205* (2013.01);
(Continued)

(58) Field of Classification Search
CPC ............................ H01L 27/15; H01L 27/153
See application file for complete search history.

(56) References Cited

U.S. PATENT DOCUMENTS 6,281,032 B1 8/2001 Matsuda et al.
6,633,322 B2 10/2003 Sakai et al.
(Continued)

FOREIGN PATENT DOCUMENTS

| EP | 2320468 A1 | 11/2011 |
|---|---|---|
| JP | 200031541 A | 1/2000 |
| WO | 2012086517 A1 | 6/2012 |

*Primary Examiner* — William Harriston

(57) ABSTRACT

An LED package (40) and manufacturing method in which the package has LED substrate (50) and a circuit substrate (54) bonded together, with the LED over the integrated circuit, and with electrical connection between the LED and corresponding integrated circuit. The package has package terminals (56a, 56b) on one face only with through vias (58a, 58b) providing connection between the LED substrate and the circuit substrate.

12 Claims, 5 Drawing Sheets

(51) Int. Cl.
| | |
|---|---|
| *H01L 23/00* | (2006.01) |
| *H01L 25/075* | (2006.01) |
| *H05B 33/08* | (2006.01) |
| *H01L 21/768* | (2006.01) |
| *H01L 21/78* | (2006.01) |
| *H01L 23/48* | (2006.01) |
| *H01L 27/02* | (2006.01) |
| *H01L 33/48* | (2010.01) |
| *H01L 33/62* | (2010.01) |

(52) U.S. Cl.
CPC *H01L 2224/81801* (2013.01); *H01L 2224/94* (2013.01); *H01L 2924/12036* (2013.01); *H01L 2924/12041* (2013.01); *H01L 2924/1304* (2013.01); *H01L 2924/351* (2013.01)

(56) References Cited

U.S. PATENT DOCUMENTS

| | | | |
|---|---|---|---|
| 6,933,707 | B2 | 8/2005 | Allen |
| 7,692,207 | B2 | 4/2010 | Erchak |
| 8,110,835 | B2 | 2/2012 | Kumar |
| 2006/0060878 | A1 | 3/2006 | Kim et al. |
| 2007/0272939 | A1* | 11/2007 | Peng ............... 257/99 |
| 2011/0285302 | A1 | 11/2011 | Choutov et al. |
| 2012/0018745 | A1* | 1/2012 | Liu et al. ............ 257/88 |

* cited by examiner

LED PACKAGE AND MANUFACTURING METHOD

CROSS-REFERENCE TO PRIOR APPLICATIONS

This application is the U.S. National Phase application under 35 U.S.C. §371 of International Application No. PCT/IB2013/056353, filed on Aug. 2, 2013, which claims the benefit of U.S. Patent Application No. 61/680,331, filed on Aug. 7, 2012. These applications are hereby incorporated by reference herein.

FIELD OF THE INVENTION

This invention relates to LED packages and methods of manufacturing such packages.

BACKGROUND OF THE INVENTION

Various LED packages are known. For example, wafer level chip scale LED packages are known which are directly solderable on a suitable substrate. Such a package typically has two contacts to the p-n junctions of the diode. The LED package can for example be mounted to a substrate carrying control circuitry for the LED, for example ESD diodes or control transistors.

By way of example, an LED die can be mounted on a silicon substrate, in which the substrate contains an embedded ESD protection diode. Contacts on the top of the substrate makes electrical connection with the LED die terminals, and the substrate has further external contacts on the same top face, outside the area where the LED die is mounted. This requires individual placement of each LED die over the substrate, for example using a ball grid array.

It is also known that in addition to ESD protection, by associating LEDs with control transistors, it becomes possible to drive and control strings of LEDs. For example, multiple LEDs in series can be controlled individually by connecting individual FET transistors parallel to each LED. By closing a transistor switch, a corresponding LED is shorted and will be switched off.

There remains a need for a cost effective and compact packaging solution for LEDs and associated control devices (such as a transistor or ESD protection diode or more complicated control circuit).

SUMMARY OF THE INVENTION

According to the invention, there is provided a method and apparatus as defined in the independent claims.

According to one aspect, there is provided a method of forming an LED package, comprising:
  forming an array of integrated circuit LEDs as part of a first semiconductor substrate;
  forming an array of integrated circuit components as part of a second semiconductor substrate;
  bonding the first and second semiconductor substrates together, with each LED of the first semiconductor substrate positioned over a corresponding integrated circuit component or components of the second semiconductor substrate, thereby making electrical connection between the LED and corresponding integrated circuit component or components;
  dicing the bonded first and second semiconductor substrates to form individual LED packages or groups of LED packages.

This method provides a circuit as part of the LED package, and directly under the LED. This allows a compact design. Wafer level bonding takes place between the LED substrate and the circuit substrate, so that only one dicing step is required to form the packages, and only one alignment process is needed between the two substrates.

Forming the array of integrated circuit components can comprise forming through vias extending between opposite faces of the second semiconductor substrate. In this way, one side of the second substrate has all the required package terminals to connect to the LED (using the vias) and to the integrated circuit component or components (directly).

Forming the array of integrated circuit components can comprise forming an array of transistors. These can be used as control devices, to control the individual LEDs. This can for example be used for dimming control or control of the pattern of illumination of an array of LEDs.

Forming the array of integrated circuit components can comprise forming an array of diodes, which can then be used for ESD protection.

According to another aspect, there is provided an LED package, comprising:
  an integrated circuit LED formed as a first semiconductor substrate and having LED connection terminals on one face;
  an integrated circuit formed as a second semiconductor substrate, wherein the one face of the first semiconductor substrate and a first face of the second semiconductor substrate are bonded together, with the LED of the first semiconductor substrate positioned over the integrated circuit, and with electrical connection between the LED and corresponding integrated circuit, wherein the package has package terminals on the opposite face of the second semiconductor substrate to first face, and the second substrate has at least one through via providing connection between a package terminal and an LED connection terminal.

This package has a single connection face enabling connection to an LED and associated circuit. The arrangement is space efficient by stacking the LED over its associated circuit.

Connection to at least one LED terminal is enabled. For example, if the LED is in series with the integrated circuit, then the package terminals can make connection to one LED terminal and one integrated circuit terminal (i.e. the ends of the series connection). The second substrate can however have at least two through vias providing connection between respective package terminals and the two LED connection terminals. Thus, connection to both LED terminals is enabled.

The integrated circuit can comprise an ESD protection diode. However, in a preferred example, the integrated circuit comprises a transistor. This can be used for controlling the operation of the LED. For example, the transistor can be in parallel with the LED. In this way, it can provide a bypass function and can thus be used to interrupt the current through the LED. This enables use as part of a resistive driver scheme, to switch off one or multiple LEDs in series between a voltage source.

The package terminals can then comprise connections to the transistor source, drain and gate.

An LED circuit can comprise at least one package of the invention mounted on a printed circuit board, wherein the printed circuit board has tracks for connection to the three package terminals.

The three terminals enable control of LED strings. The gate terminal provides a switching function which is activated by the associated package terminal at the bottom of the device.

BRIEF DESCRIPTION OF THE DRAWINGS

An example of the invention will now be described in detail with reference to the accompanying drawings, in which.

All the Figures are schematic, not necessarily to scale, and generally only show parts which are necessary in order to elucidate the invention, wherein other parts may be omitted or merely suggested.

DETAILED DESCRIPTION

The invention provides an LED package and manufacturing method in which the package has an LED substrate and a circuit substrate bonded together, with the LED over the integrated circuit, and with electrical connection between the LED and corresponding integrated circuit. The package has package terminals on one face only with through vias providing connection between the package terminals on one substrate and the LED connections of the other substrate. Thus, even though the package has two substrates, it has a single connection face for mounting over a carrier, such as a PCB, in simple manner.

The single connection face enables electrical connection to the LED and to the associated circuit. The arrangement is space efficient by stacking the LED over its associated circuit.

Figure 1:
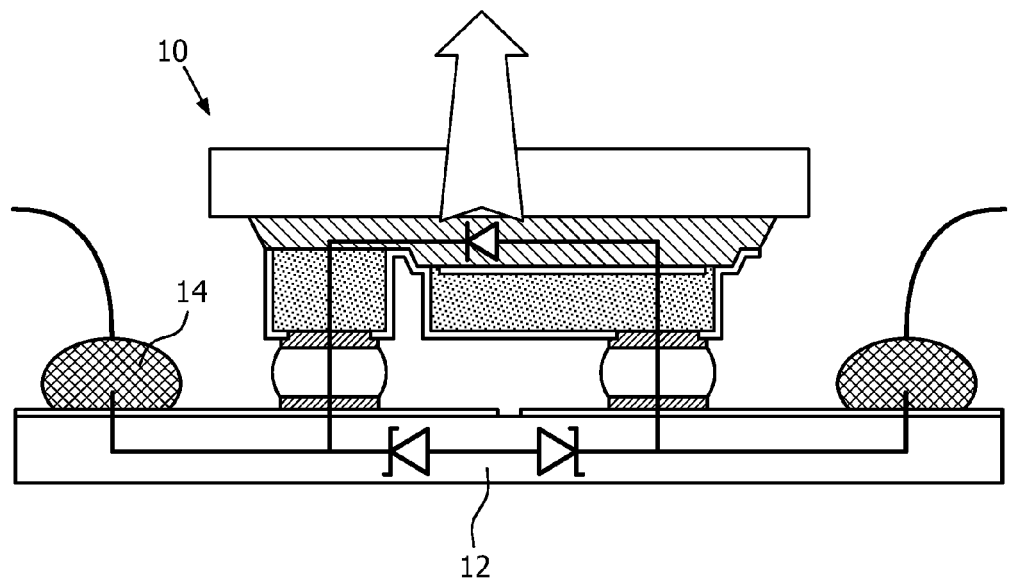
FIG. 1 shows a known LED package mounted on a submount.

FIG. 1 shows a known LED package. The LED 10 is formed as a discrete package which is mounted on a silicon submount 12 for example by solder balls. Connections to the LED package are made through the solder balls, and external connections from the submount are made by wirebonds 14. As shown schematically in FIG. 1, the submount 12 can implement a pair of ESD protection diodes. Thus, ESD protection is one reason for associating additional components with each LED.

Figure 2:
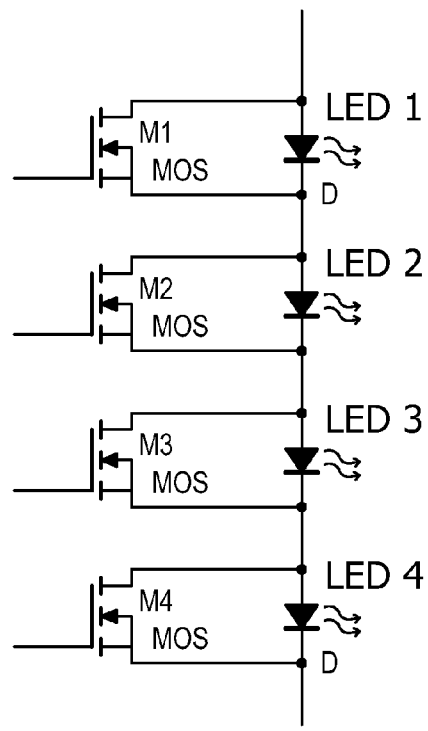
FIG. 2 shows a known circuit which provides a switch for each LED of a string.

Another reason for associating additional components with each LED is to provide switching functionality. FIG. 2 shows a known circuit which provides a parallel switch M1 to M4 for each LED of a string of LEDs, LED1 to LED4. By turning on a switch, a bypass path is provided so that the individual LED is turned off.

Figure 3:
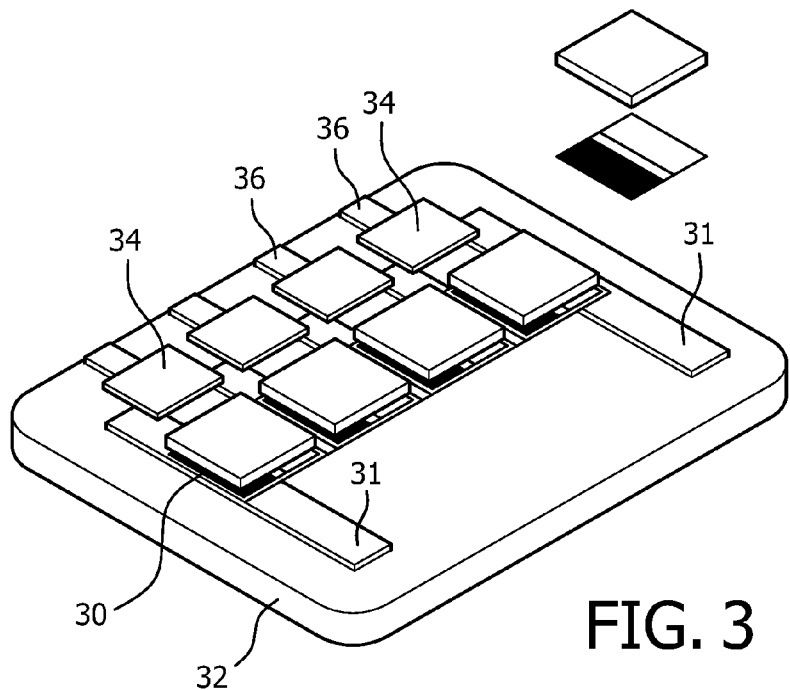
FIG. 3 shows a known way to implement the circuit of FIG. 2.

FIG. 3 shows a known way to implement the circuit of FIG. 2. A number of discrete LED packages 30 is mounted over tracks on a PCB 32. Two tracks 31 connect to two power lines. Additional tracks between the individual LED packages 30 provide the series connections between the LED packages. Further tracks connect to the transistors 34, also mounted on the PCB, and the transistors have PCB tracks which form control lines 36 connecting to their gates. FIG. 3 also shows in exploded form one of the LED packages. This arrangement takes up a significant amount of space. It also requires mounting of the LED packages as well as the transistors.

Figure 4:
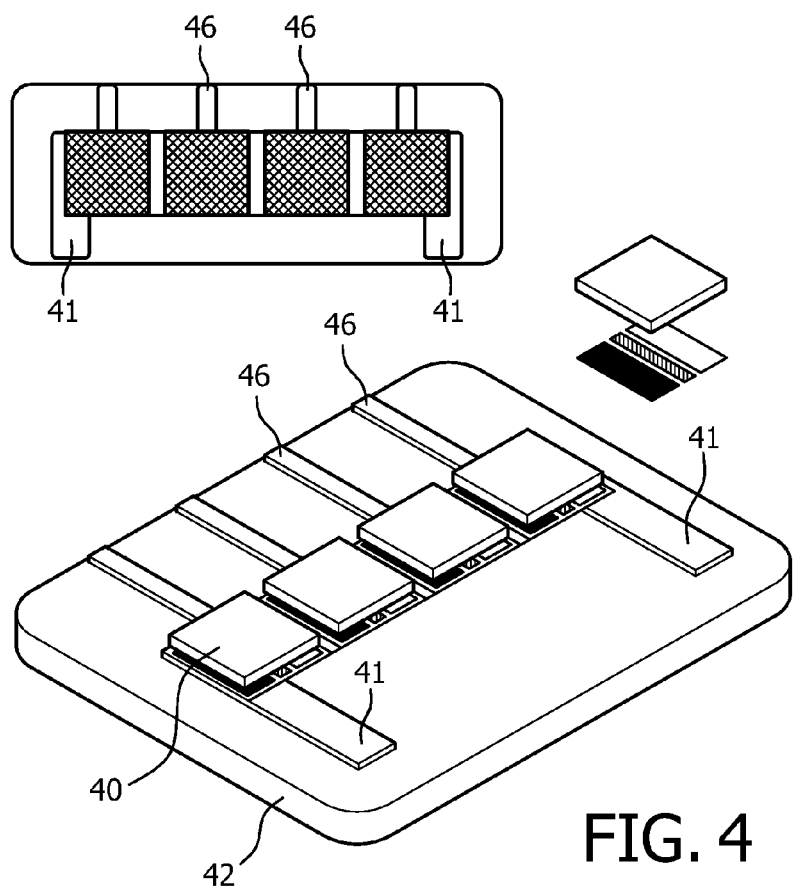
FIG. 4 shows a circuit of the invention.

FIG. 4 shows a circuit of the invention. The circuit again has LED packages 40 mounted on a PCB 42, with PCB tracks 42 connecting to power lines for the series arrangement of LEDs. The LED packages 40 integrate the LED and associated transistor into a single package, with the LED overlying the transistor. The package has package terminals on only one face, namely the face against the PCB 42. There are three package terminals, two power line terminals and a control terminal for connecting to the transistor gate within the package. The control terminal connects to a PCB track 46. This provides a more compact arrangement and with reduced mounting requirements. FIG. 4 also shows in exploded form one of the LED packages as well as a plan view.

Figure 5:
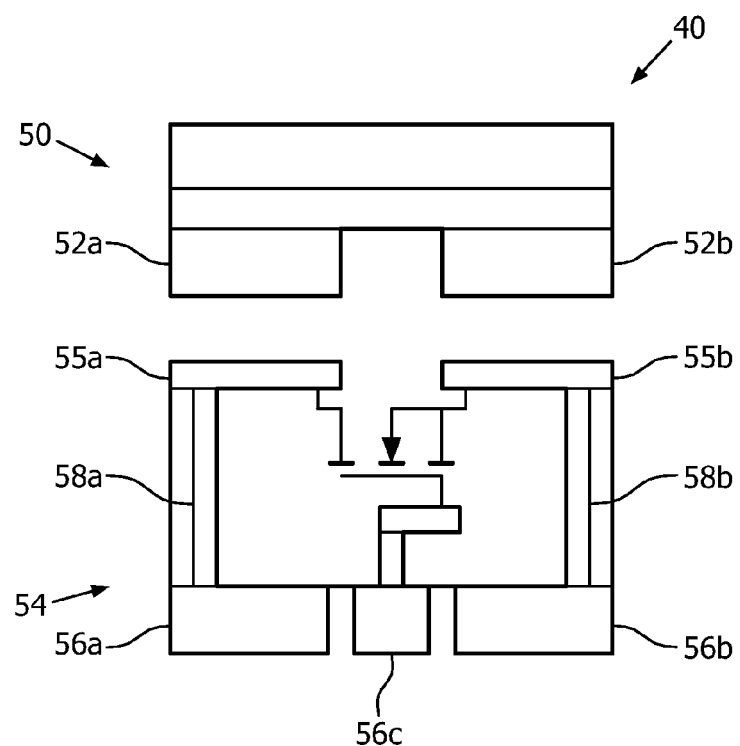
FIG. 5 shows one LED package used in the circuit of FIG. 4.

FIG. 5 shows one LED package 40 used in the circuit of FIG. 4 in more detail. Each LED package comprises an integrated circuit LED formed as a first semiconductor substrate 50 and having LED connection terminals 52a, 52b on one face. These terminals connect to the n- and p-junctions of the LED. The LED can be a pn diode, or a pin diode or any other known diode configuration. It can be vertical or lateral.

An integrated circuit (in this example the switching transistor) is formed as a second semiconductor substrate 54. The face of the first second semiconductor substrate 50 which carries the terminals 52a, 52b and a first face of the second semiconductor substrate 54 are bonded together. The two substrates are shown separated in FIG. 5 for clarity.

The bonding face of the second substrate 54 carries contact pads 55a, 55b for connection to the terminals 52a, 52b.

When connected, the LED of the first semiconductor substrate 50 is positioned over the integrated circuit, and with electrical connection between the LED and corresponding integrated circuit.

The package has package terminals 56a, 56b, 56c on the opposite face of the second semiconductor substrate 54. The second substrate 54 has through vias 58a, 58b providing connection between two of the package terminals 56a, 56b and the contact pads 55a, 55b for connection to the LED connection terminals 52a, 52b. A third package terminal 56c connects to the gate of the transistor, which is formed within the semiconductor substrate in conventional manner.

In this way, the single set of package terminals enables connection to the LED as well as to the transistor. If the transistor of the package is not needed for the particular use of the LED package, no connection needs to be made to the transistor gate, and the package can be used as a normal two-terminal LED package.

Figure 6:
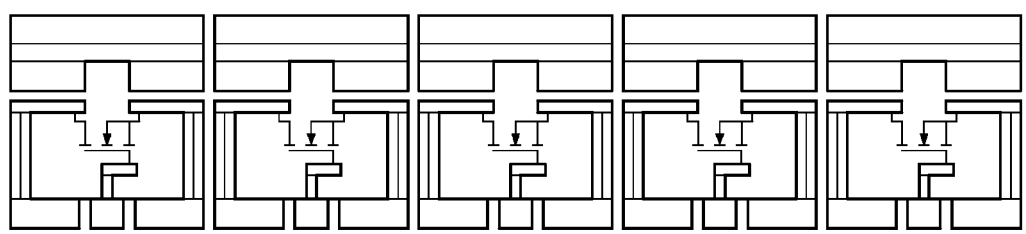
FIG. 6 shows a side view of a string of LED packages after wafer level bonding, before dicing.

FIG. 6 shows a cross-sectional view of a string of LED packages and shows the two substrates in contact with each other after wafer level bonding before dicing.

Figure 7A:
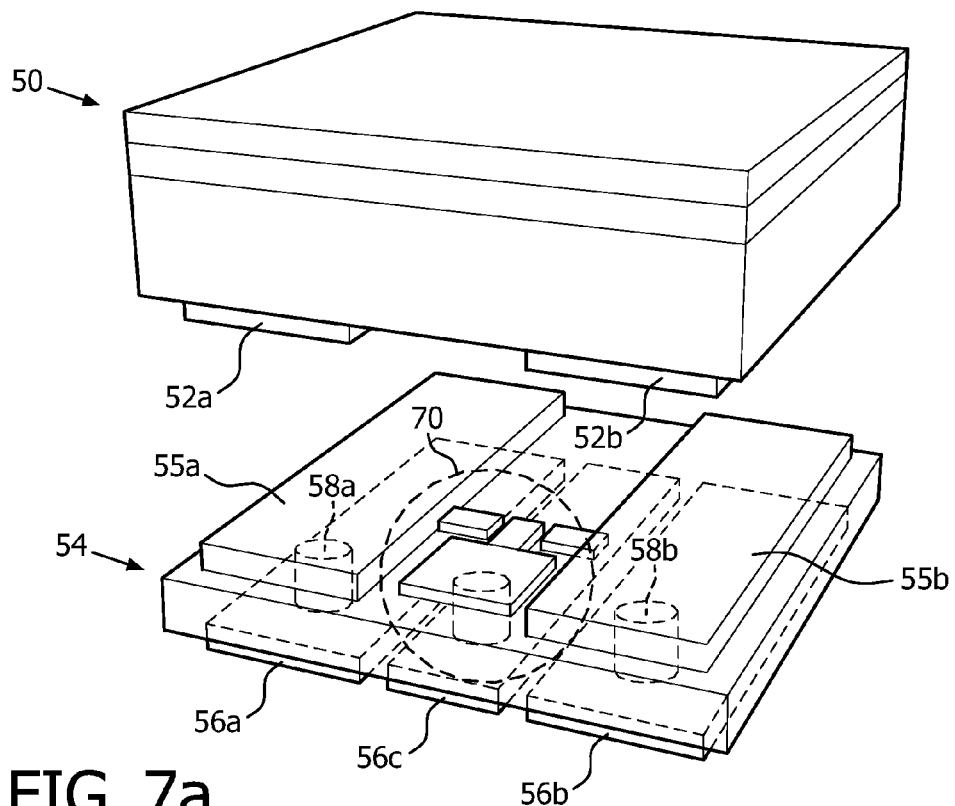
FIG. 7a shows an exploded view of one package in perspective shaded view and FIG. 7b shows the same view as a line drawing.
Figure 7B:
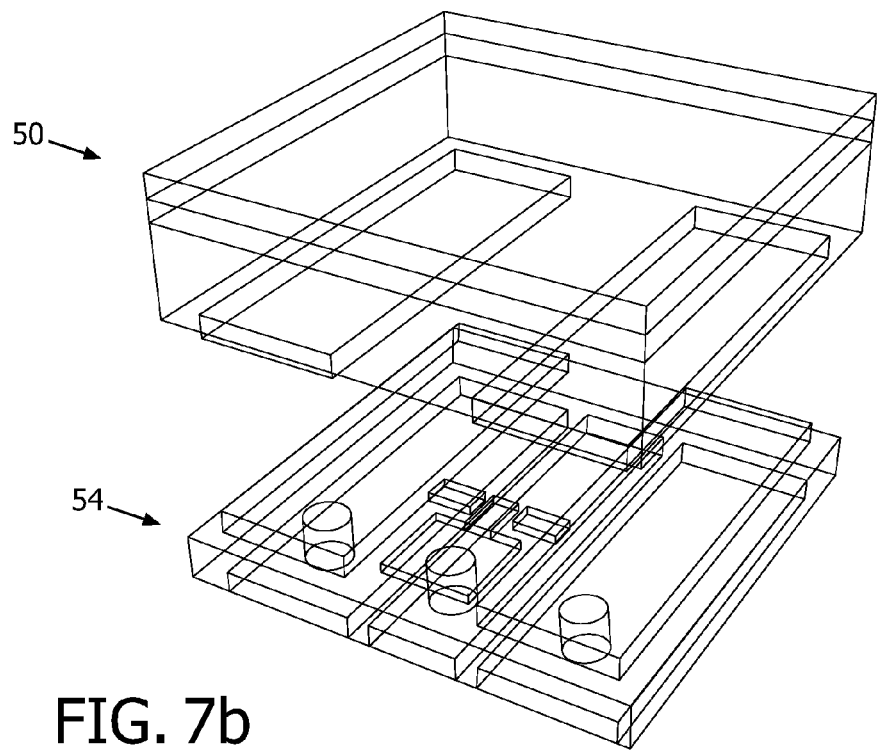

FIG. 7a shows an exploded perspective view of one package. The same reference numbers are used as in FIG. 5. The transistor structure of the second substrate 54 is shown generally at 70, connected between the contact pads 55a, 55b. FIG. 7a is a perspective shaded view and FIG. 7b shows the same view as a line drawing.

In the example shown, the gate is formed in the first face of the second substrate. A via is formed to enable connection to the gate from the package terminals which are on the opposite side of the second substrate.

Note that the transistor structure could be on the bottom surface of the second semiconductor substrate 54, and in this case no via for the gate would be needed.

The arrangement can be manufactured more easily. In particular, wafer level bonding between the two substrates is possible, before dicing.

Figure 8:
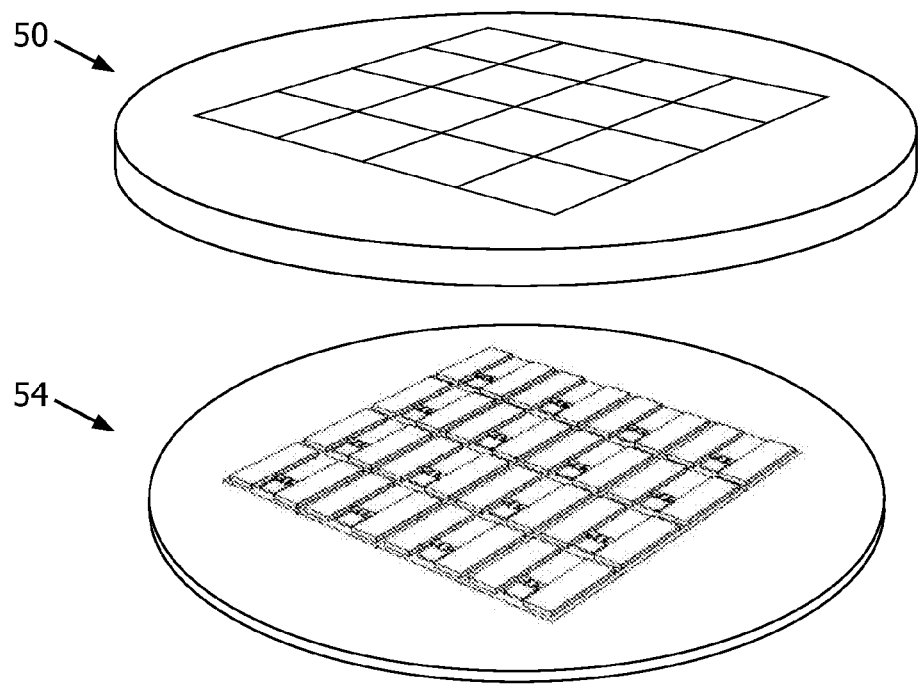
FIG. 8 shows the separate device arrays before wafer level bonding and before dicing, and from above.
Figure 9:
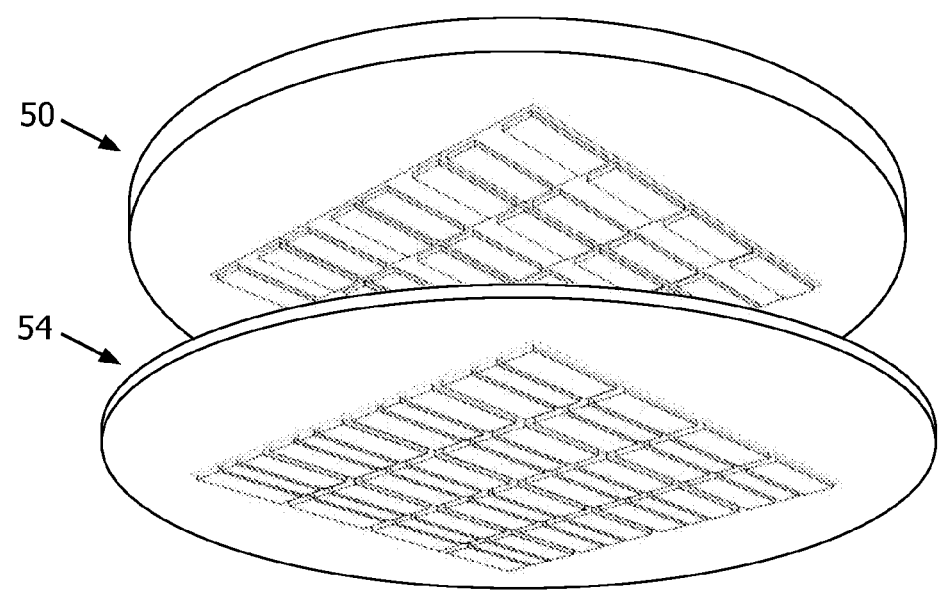
FIG. 9 shows the separate device arrays before wafer level bonding and before dicing, and from below.

As shown in FIG. 8, the two substrates 50, 54 can be formed as full arrays. Wafer bonding between the two substrates is then carried out. Possible interconnect methods include micro-bumps or a gold nanosponge. FIG. 8 shows a view from above, and shows the dicing lines at the top of the top substrate 50 and the contact pads at the top of the bottom substrate 54. FIG. 9 shows a view from below, and shows the LED contact pads at the bottom of the top substrate 50 and the package terminals at the bottom of the bottom substrate 54.

The wafer level bonding should avoid high temperature processes, in order to avoid stress mismatch due to thermal expansion. With suitable substrate designs, the ultra-sonic bonding typically used for single die attach methods can be used. Alternatively, cold interconnect methods can be applied, such as electrically conductive gluing.

Only after wafer level bonding, the individual LEDs, or else groups of LEDs to form the individual packages, are separated. Wafer level connections using through silicon via technology are known for 3D packaging solutions. These allow contacts to be brought to the bottom of a device, as shown for the second substrate 54.

In the example above, a parallel switch is added to each LED. Of course, serial switches can also be added in the same way. In this case, external connection to both LED terminals may not be needed. Instead, connections to each end of the series circuit, as well as the transistor gate, are then needed. Thus, the three package terminals can then comprise the transistor source or drain (the one not connected to the LED), the transistor gate and only one of the LED connection terminals.

The circuit is shown as a single transistor, but it may instead be an ESD diode. Of course more complex circuits could be provided in the second substrate. For example, an ESD diode can be integrated into the package as well as the transistor. Furthermore, a more complex transistor control circuit can be implemented in each package, for example for local dimming control.

The invention can be used to form LED packages generally. Of particular interest are packages for LED arrays that require control of individual LEDs. In particular, in automotive applications a dynamic LED matrix array is known for providing dynamic control of the light direction.

The use of a transistor with each LED enables multiple LEDs in series to be controlled individually. The invention provides the integration of a switch into the LED package, directly under the LED. This allows a compact driver design and simplifies the control of LED strings.

Furthermore, the components could be suitable for multi-LED sources driven from mains voltage in which the forward voltages across the LEDs are controlled according to the phase of the mains voltage. In a 220 V mains voltage network, the actual voltage oscillates periodically between +325 and −325 V. If an LED string contains 100 LEDs with an average forward voltage of around 3V, the mains voltage can be applied directly to the string without risk of over-driving the LEDs (in practice, such a circuit would typically contain a rectifier and a protective resistor). If all LEDs remain in the string at all times, the voltage at the individual LEDs is at times of the mains cycle below the switch-on voltage for light generation. It is known that in synchronism with the reducing mains voltage, an increasing number of LEDs can be switched off to allow for the remaining LEDs to provide generation of light efficiently.

The processes used to form the integrated circuit LED and the integrated circuit transistor have not been described in detail, as they are routine. Indeed any diode technology and any transistor technology can be used. Furthermore, the different substrates can use different materials and manufacturing processes as they are formed independently.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method of forming an LED package, comprising:
   forming a plurality of integrated circuit LEDs with LED connection terminals as part of a first semiconductor substrate;
   providing a second semiconductor substrate having a first face and second face opposite the first face;
   forming a plurality of switching transistors on the first face;
   forming through vias extending between the first face and the second face;
   forming package terminals on the second face;
   bonding the first semiconductor substrate and the first face of the second semiconductor substrates together, wherein each integrated circuit LED is positioned over a corresponding switching transistor, thereby making electrical connection between the integrated circuit LED and the corresponding switching transistor; and
   dicing the bonded first and second semiconductor substrates to form individual LED packages or groups of LED packages, wherein:
   each LED package has an integrated circuit LED, two LED connection terminals, a switch transistor, and three package terminals;
   the three package terminals are coupled to the switching transistor's source or drain, the switching transistor's gate, and one of the two LED connection terminals;
   at least one through via in the second semiconductor substrate that couples one of the three package terminals to one of the two LED connection terminals, and
   the switching transistor is electrically connected in series with the LED.

2. An LED package, comprising:
   an integrated circuit LED formed on a first semiconductor substrate, the integrated circuit LED having first and second LED connection terminals disposed on a first face of the first semiconductor substrate;
   a switching transistor formed on a second face of a second semiconductor substrate;

first and second contact pads on the second face of the second semiconductor substrate, the first contact pad being coupled to the first LED connection terminal and a source of the switching transistor, the second contact pad being coupled to the second LED connection terminal and a drain of the switching transistor;

first and second power line terminals and a control terminal on a third face of the second semiconductor substrate opposite the second face of the second semiconductor substrate, the control terminal being coupled to a gate of the switching transistor; and first and second through vias in the second semiconductor substrate coupling the first and the second power line terminals to the first and the second contact pads, wherein:

the first face of the first semiconductor substrate and the second face of the second semiconductor substrate are bonded together; and the integrated circuit LED is positioned over the switching transistor with electrical connections between the first and the second LED connection terminals of the integrated LED and the first and the second contact pads of the switching transistor so the switching transistor is electrically connected in parallel with the LED.

3. A LED as claimed in claim 2, further comprising a third through via coupling the switching transistor's gate to the control terminal.

4. An LED circuit comprising at least one LED package as claimed in claim 2 mounted on a printed circuit board, wherein the printed circuit board has traces for connection to the first and second power line terminals and the control terminal.

5. An LED circuit as claimed in claim 4, comprising multiple LED packages in series.

6. An LED circuit as claimed in claim 4, driven from a mains voltage.

7. An LED package, comprising:
an integrated circuit LED formed on a first semiconductor substrate, the integrated circuit LED having two LED connection terminals disposed on a first face of the first semiconductor substrate;
a switching transistor formed on a second face of a second semiconductor substrate;
three package terminals on a third face of the second semiconductor substrate opposite the second face of the second semiconductor substrate;
at least one through via in the second semiconductor substrate that couples one of the three package terminals to one of the two LED connection terminals, wherein:
the first face of the first semiconductor substrate and the second face of the second semiconductor substrate are bonded together;
the integrated circuit LED positioned over the switching transistor with electrical connections between the integrated circuit LED and the switching transistor;

the three package terminals comprise connections to the switching transistor's source or drain, the switching transistor's gate, and the one of the two LED connection terminals; and
the switching transistor is electrically connected in series with the LED.

8. An LED package as claimed in claim 7, further comprising another through via that couples another one of the three package terminals to the switching transistor's gate.

9. An LED circuit comprising at least one LED package as claimed in claim 7 mounted on a printed circuit board, wherein the printed circuit board has traces for connection to the package terminals.

10. An LED circuit as claimed in claim 9, comprising multiple LED packages in series.

11. An LED circuit as claimed in claim 9, driven from a mains voltage.

12. A method of forming an LED package, comprising:
forming a plurality of integrated circuit LEDs as part of a first semiconductor substrate;
forming a plurality of switching transistors as part of a second semiconductor substrate;
forming contact pads on a first face of the second semiconductor substrate, the contact pads being coupled to sources and drains of the plurality of switching transistor;
forming through vias extending between the first face and a second face of the second semiconductor substrate, the vias being coupled to the contact pads;
forming power line terminals and control terminals on the second face, wherein:
the through vias couple the power line terminals and the contact pads; and
the control terminals are coupled to gates of the plurality of switching transistors;
bonding the first semiconductor substrate and the first face of the second semiconductor substrates together, wherein each integrated circuit LED of the first semiconductor substrate is positioned over a corresponding switching transistor, thereby making electrical connection between the integrated circuit LED and the corresponding switching transistor; and
dicing the bonded first and second semiconductor substrates to form individual LED packages or groups of LED packages, wherein:
each LED package includes an integrated circuit LED, a switch transistor, two power line terminals, and a control terminal;
the control terminal is coupled to a gate of the switching transistor;
the two power line terminals are coupled to a drain and a source of the switching transistor; and
the switching transistor is electrically connected in parallel with the LED.

* * * * *